(12) United States Patent  (10) Patent No.: US 7,607,061 B2
Comai et al.  (45) Date of Patent: Oct. 20, 2009

(54) SHRINK TEST MODE TO IDENTIFY NTH ORDER SPEED PATHS

(75) Inventors: Michael A. Comai, Austin, TX (US); Philip E. Madrid, Austin, TX (US)

(73) Assignee: Global Founderies Inc., Cayman (KY)

( * ) Notice: Subject to any disclaimer, the term of this patent is extended or adjusted under 35 U.S.C. 154(b) by 253 days.

(21) Appl. No.: 11/830,116

(22) Filed: Jul. 30, 2007

(65) Prior Publication Data

US 2009/0037788 A1  Feb. 5, 2009

(51) Int. Cl.
*G06F 11/00* (2006.01)
(52) U.S. Cl. .................................. 714/744; 714/731
(58) Field of Classification Search ................. 315/403; 327/281, 291; 714/724, 726, 744, 731
See application file for complete search history.

(56) References Cited

U.S. PATENT DOCUMENTS

| | | | |
|---|---|---|---|
| 5,359,267 A * | 10/1994 | Wilber | 315/403 |
| 6,107,854 A * | 8/2000 | Wong et al. | 327/281 |
| 6,671,848 B1 * | 12/2003 | Mulig et al. | 714/744 |
| 6,966,021 B2 * | 11/2005 | Rajski et al. | 714/726 |
| 6,980,042 B2 * | 12/2005 | LaBerge | 327/291 |
| 6,996,021 B2 | 2/2006 | Derner et al. | |
| 6,996,032 B2 | 2/2006 | Ganry | |
| 7,290,188 B1 * | 10/2007 | Peterson et al. | 714/724 |

* cited by examiner

*Primary Examiner*—David Ton
(74) *Attorney, Agent, or Firm*—Lawrence J. Merkel; Meyertons, Hood, Kivlin, Kowert & Goetzel, P.C.

(57) ABSTRACT

In one embodiment, an integrated circuit comprises first circuitry; a first clock generator coupled to supply a first clock to the first circuitry, and a control unit coupled to the first clock generator. The first clock generator is coupled to receive an input clock to the integrated circuit and is configured to generate the first clock. The control unit is also coupled to receive a trigger input to the integrated circuit. During a test of the integrated circuit, the control unit is configured to cause the first clock generator to generate the first clock at a first clock frequency, The control unit is configured to cause the first clock generator to generate the first clock at a second frequency greater than the first clock frequency for at least one clock cycle responsive to an assertion of the trigger input.

20 Claims, 5 Drawing Sheets

SHRINK TEST MODE TO IDENTIFY NTH ORDER SPEED PATHS

BACKGROUND

1. Field of the Invention

This invention is related to testing integrated circuits and, more particularly, to identifying speed paths for correction to permit subsequent revisions of the integrated circuit to operate at a higher frequency.

2. Description of the Related Art

Integrated circuits of various types are becoming part of numerous products across many different industries. As integrated circuit fabrication processes have continued to shrink, the size of devices that can be fabricated on a semiconductor substrate (e.g. transistors) has shrunk and thus the number of devices included on a given integrated circuit (or "chip") has skyrocketed. Accordingly, designing and testing the chips to ensure quality, error-free operation and to ensure high manufacturing yields at a desired operating frequency has become more challenging.

During the design phase of an integrated circuit, various timing tools are typically utilized to estimate the timing of the circuitry (and thus to estimate the highest clock frequency at which the integrated circuit would operate correctly). For example, static timing analysis tools, Spice simulations, etc. are used during the design phase. However, all such tools are estimates of the actual operation of the circuit. Some paths that are identified as having slow timing may be faster than estimated, and other paths may be slower than estimated. Additionally, factors that are not accounted for in the tools may change the timing characteristics of various paths.

After a version of the integrated circuit design is "taped out" and fabricated, real circuitry is available for testing and characterization. One form of testing is speed path debugging. In speed path debugging, various test patterns are run at various desired clock frequencies (or at various increasing clock frequencies) to locate the circuit paths (speed paths) that limit the clock frequency. That is, the test patterns are executed on the integrated circuit and, if a failure is detected, the failure is analyzed to locate the speed path that is causing the failure. For example, once a failure is identified at a particular clock cycle of the test pattern, the test pattern is executed at a lower (passing) frequency and the state of the integrated circuit at the failing clock cycle and nearby clock cycles is scanned out (e.g. all the state in various flops and other clocked storage devices that are attached to scan chains in the integrated circuit is scanned out). The test pattern can also be executed at the failing frequency, and the state can be scanned out again for the same clock cycles. By comparing the passing and failing state, the circuitry that is causing the failure can be identified with a reasonable degree of specificity. By improving the timing characteristics of the speed path (e.g. by changing the circuitry, reducing the load on the path, etc.) in a subsequent version of the integrated circuit, the speed path may no longer limit the frequency or may permit a higher frequency than in the previous version.

The above procedure allows one speed path to be detecting for a given test pattern. There may be other speed paths that could occur later in the test pattern, or that could be slightly faster than the identified speed path and thus cannot be detected. One mechanism used to allow further testing is "stretch mode". In stretch mode, the test pattern is run at speed except for the failing clock cycle, which is "stretched" (made longer) so that the speed path doesn't cause a failure. For example, the clock frequency may be halved for the failing clock cycle, doubling the clock period for the failing clock cycle. Potentially, other speed paths can be identified. In some cases, a subsequently identified failure may be the same speed path that has been previously identified.

Other mechanisms for testing exist. For example, the AMD Athlon™ processors include a pattern generator that receives the clock output of the phase locked loop (PLL) and can be programmed to provide a pattern on the clock provided to the clocked storage devices. That pattern can change on a cycle by cycle basis (e.g. ½ frequency, ¼ frequency, etc.). For example, a 64 clock cycle pattern could be programmed into the pattern generators.

SUMMARY

In one embodiment, an integrated circuit comprises first circuitry; a first clock generator coupled to supply a first clock to the first circuitry, and a control unit coupled to the first clock generator. The first clock generator is coupled to receive an input clock to the integrated circuit and is configured to generate the first clock. The control unit is also coupled to receive a trigger input to the integrated circuit. During a test of the integrated circuit, the control unit is configured to cause the first clock generator to generate the first clock at a first clock frequency, The control unit is configured to cause the first clock generator to generate the first clock at a second frequency greater than the first clock frequency for at least one clock cycle responsive to an assertion of the trigger input.

In an embodiment, a method comprises clocking first circuitry within an integrated circuit with a first clock at a first clock frequency during a test of the integrated circuit, wherein the first clock is coupled to the first circuitry; detecting a preselected clock cycle in the test; and clocking the first circuitry at a second clock frequency that is greater than the first clock frequency for at least the preselected clock cycle in the test.

BRIEF DESCRIPTION OF THE DRAWINGS

The following detailed description makes reference to the accompanying drawings, which are now briefly described.

Figure 1:
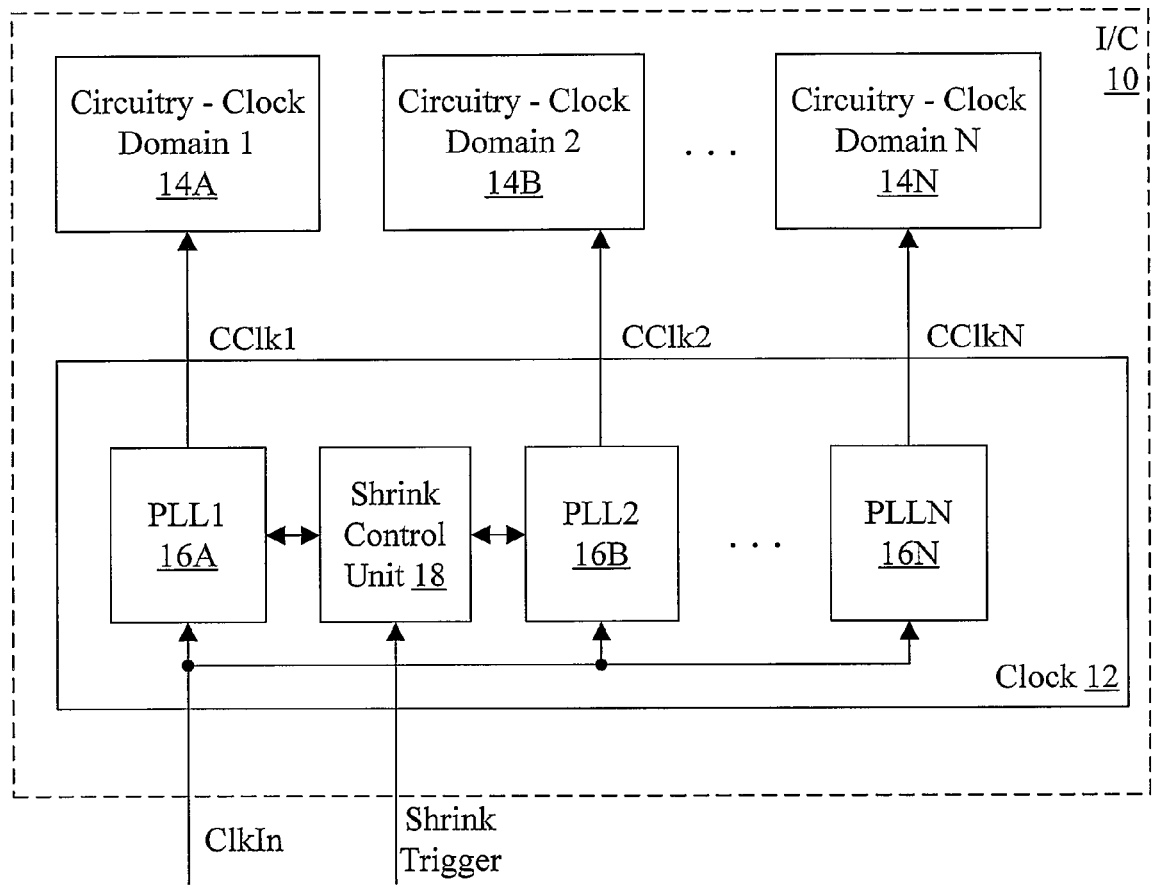
FIG. 1 is a block diagram of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit (I/C) 10 is shown. In the illustrated embodiment, the I/C 10 includes circuitry that is divided into various clock domains, each of which has a corresponding phase locked loop (PLL) in the clock section 12. Thus, for example, circuitry 14A-14N may each be in a different clock domain corresponding to respective PLLs 16A-16N. The PLLs 16A-16N generate respective clocks (e.g. CClk1 from the PLL 16A, CClk2 from the PLL 16B, and CClkN from the PLL 16N). The circuitry 14A-14N is coupled to the respective PLL 16A-16N to receive the respective clock CClk1 to CClkN. Each of the PLLs 16A-16N is coupled to receive a clock input ClkIn, provided on an input pin of the integrated circuit 10. Additionally, the clock section 12 includes a shrink control unit 18 coupled to at least a subset of the PLLs 16A-16N (e.g. the PLLs 16A-16B in FIG. 1). The shrink control unit 18 is also coupled to receive a shrink trigger signal on another input pin of the integrated circuit 10. It is noted that the input pins may be coupled to receiver circuits that convey the ClkIn clock and the shrink trigger to the clock section 12.

To test for speed paths in the integrated circuit 10, at least some of the PLLs 16A-16N may be configured to perform a shrink mode. For example, in the illustrated embodiment, the PLLs 16A-16B may perform the shrink mode. The PLL 16N may not perform the shrink mode in this embodiment (that is, it may operate normally based on the ClkIn input when one or more of the PLLs 16A-16B are performing the shrink mode). In other embodiments, all PLLs 16A-16N may be configured to perform the shrink mode. In the shrink mode, the clock section may generate clocks for the circuitry 14A-14N at a first clock frequency (or more briefly, first frequency). At a preselected clock cycle, at least one clock cycle at second frequency is generated by at least one of the PLLs 16A-16N for the corresponding circuitry 14A-14N. The second frequency is higher than the first frequency. In this fashion, the preselected clock cycle may be "sensitized" to determine if it has a speed path that fails at the second frequency. Since other clock cycles are at the lower first frequency, any speed paths that may be exercised in those other clock cycles may not cause a failure. Thus, the preselected clock cycle may be "shrunk" in time compared to the other clock cycles in the test. If the second frequency is increased high enough to cause the test to fail, the speed path for the preselected clock cycle may be determined, even if the speed path is faster than other speed paths that may be exercised in the test pattern. Accordingly, in some embodiments, multiple speed paths may be identified using a test pattern, by running the test pattern multiple times with different clock cycles as the preselected clock cycle. The slowest speed path may be referred to as the first order speed path. Other paths may be referred to as second order, third order, etc., based on the relative slowness of the path compare to other paths. Thus, Nth order speed paths of the integrated circuit may be determinable using a test pattern and the shrink mode.

In one embodiment, the second frequency is twice the first frequency. In order to regain synchronization with other clocks from other PLLs 16A-16N, the PLL(s) 16A-16B which performed the clock shrink may perform two clock cycles at the second frequency, followed by one clock cycle at a frequency that is ½ of the first frequency (¼ of the second frequency). Other embodiments may have the second frequency equal to other multiples of the first frequency, and may use a different number of clocks at the second frequency and one or more slower clocks to regain synchronization. Additionally, other embodiments may use different patterns of the clocks at the various frequencies. For example, one clock cycle at the second frequency, followed by one clock cycle at ½ of the first frequency, followed by another clock cycle at the second frequency may be used as the pattern. As another example, one clock cycle at one ½ of the first frequency followed by two clock cycles at the second frequency may be used as the pattern. Any combination of clocks at the various frequencies may be used to sensitize a preselected clock cycle (that is clocked at the second frequency) and to recover synchronization may be used.

The preselected clock cycle (of the CClk) may be within a clock cycle of the ClkIn clock in which the shrink trigger is asserted. The test pattern may thus be arranged so that the shrink trigger is asserted for the desired clock cycle of the ClkIn clock. The PLLs may generate clocks at frequencies that are multiples of the frequency of the ClkIn clock, and thus the desired CClk clock cycle may be one of the clock cycles within the triggered ClkIn clock cycle. The preselected clock cycle may be identified within the ClkIn clock cycle via one or more values programmed into the shrink control unit 18 prior to initiating the test. Thus, the shrink control unit 18 may cause the PLL 16A-16B that is to perform the clock shrink to generate clocks at the first frequency, detect the trigger assertion, detect the preselected clock cycle, cause the PLL 16A-16B to generate at least one clock cycle at the second clock frequency (e.g. two clock cycles at the second frequency, in this embodiment), cause the PLL 16A-16B to generate the clock cycle at ½ of the first frequency, and then generate clocks at the first frequency again for the remainder of the test. Other PLLs 16A-16N may generate clocks at the first frequency through the test. In some embodiments, more than one PLL 16A-16B may perform the clock shrink at the desired clock cycle.

The circuitry 14A-14N is illustrated by clock domain, where each clock domain corresponds to one of the PLLs 16A-16N. Generally, circuitry may be in a clock domain if the clocked storage devices and other clocked circuit elements of the circuitry are controlled by the clock associated with the clock domain. The clock may be buffered, gated, delayed, used to generate pulses, or otherwise manipulated, but may be the source of the clocks. Clocked storage devices/elements within the clock domain may generally have a known, fixed relationship. On the other hand, circuitry in a different clock domain may not have a fixed relationship. Temporary phase differences between the outputs of different PLLs, different delays through the circuits, etc. may cause uncertainty in the relationship. In some cases, different clock domains may operate at different frequencies.

The ClkIn clock input is a clock reference for the PLLs 16A-16N. That is, the PLLs 16A-16N may phase lock to the ClkIn clock input. The frequencies of the clocks generated by the PLLs 16A-16N may be multiples of the frequency of the ClkIn clock input. For example, the clock input may be 200 Mhz in normal operation, and the PLLs 16A-16N may generate output clocks having frequencies in the GHz range. Thus, various multiples in the range of 5-50 may be supported, in one embodiment. Other embodiments may support higher and/or lower multiples as well.

When shrink mode is to be used, in one embodiment, the ClkIn frequency may be reduced by ½ (e.g. to 100 MHz, in the above described example). This reduction may allow non-shrink mode PLLs (e.g. the PLL 16N) to operate at ½ the test frequency, without modification.

It is noted that, while the PLLs 16A-16N are illustrated in FIG. 1, generally any clock generators may be used. A clock generator may generally refer to any circuitry that may receive a clock (and potentially other control inputs) and generate a clock at a desired frequency. It is noted that a clock cycle may comprise one period, from one rising edge to the next rising edge, of a given clock. It is further noted that a circuit may be referred to as being "clocked by" a given clock or a clock may be referred to as "clocking" a circuit. Such references may refer to the given clock controlling clocked storage devices and other clocked devices in the circuit. It is noted that the above description refers to frequencies that are multiples of other frequencies. There may be some variation from the nominal multiple due to circuit inaccuracies, manufacturing variations, etc. Thus, a multiple need not be an exact multiple, to take account of such variations from nominal.

Figure 2:
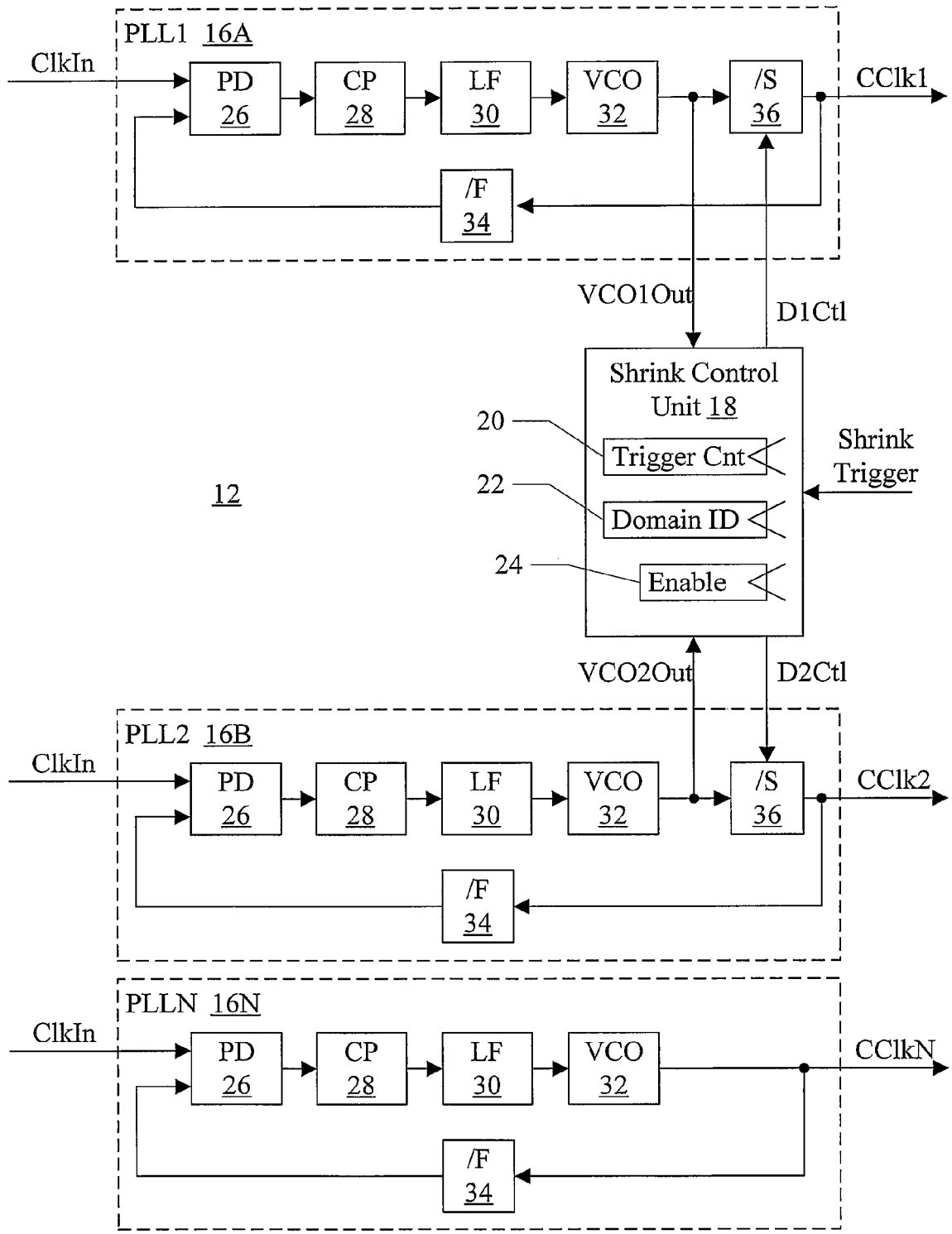
FIG. 2 is a block diagram illustrating PLLs and a shrink control circuit shown in FIG. 1.

Turning next to FIG. 2, a block diagram illustrating the clock section 12 in more detail is shown. The shrink control unit 18 and the PLLs 16A-16N are shown. Within the shrink control unit 18 is a trigger count (Trigger Cnt) register 20, a domain identifier (ID) register 22, and an enable register 24. The PLLs 16A-16N each include phase detectors (PD) 26, charge pumps (CP) 28, loop filters (LF) 30, voltage controlled oscillators (VCO) 32, and feedback clock divider circuits (/F) 34 (or more briefly, feedback dividers 34). Additionally, the PLLs that are configured to perform shrink mode (e.g. the PLLs 16A-16B in this embodiment) further include a shrink clock divider circuit (/S) 36 coupled between the VCO 32 and the output clock CClk (or more briefly, shrink dividers 36). The shrink control unit 18 is coupled to receive the outputs of the VCOs 32 in the PLLs 16A-16B (VCO1Out and VCO2Out, respectively) and is coupled to provide control to the /S divider 36 in the PLLs 16A-16B (D1Ctl and D2Ctl, respectively).

Shrink mode may be enabled by programming the enable in the register 24 (e.g. the enable may be a bit which may be set to indicate that the shrink mode is enabled and clear to indicate that the shrink mode is disabled, or vice versa). The domain ID register 22 may be programmed with an indication of which clock domain (which PLL) is to be tested with the shrunken (higher frequency) clock cycle. In other embodiments, more than one domain may be programmed into the domain ID register, if more than one domain is to be clocked as the higher frequency. In still other embodiments, all domains may be tested and the domain ID register 22 may not be needed. In yet other embodiments, one or more domains may be tested and all domains may be tested using various encodings of the domain ID register 22. The trigger count register 20 may be programmed with a count of the number of clock cycles (of the output of the VCO 32, in this embodiment) to occur before the shrink control unit is to cause the higher frequency clock cycles. The trigger count may be measured from the rising edge of the ClkIn clock for which the shrink trigger is asserted, in one embodiment. In other embodiments, the trigger count may be measured in clock cycles of the CClk for the corresponding PLL 16A-16B.

The feedback divider 34 may divide the frequency of the CClk output from each PLL by a factor of F (which may be programmable, in one embodiment) to provide a clock to the phase detector 26 for comparison to the ClkIn reference clock. Thus, the CClk outputs may have a frequency that is F times the frequency of ClkIn. Generally, the phase detector 26 may detect the phase difference between the ClkIn clock and the output of the feedback divider 34, and may control the charge pump 28 to increase or decrease the control voltage to the VCO 32 to attempt to phase lock the output of the feedback divider 34 to the ClkIn clock. The output of the charge pump 28 is filtered by the loop filter 30 (which may filter out high frequency variations in the charge pump output for loop stability) and the filtered voltage may be provide as the control voltage to the VCO 32.

The additional shrink divider 36, in non-shrink modes, may be set to divide by one and thus may have no effect on the operation of the PLL 16A or 16B (except for possible delay through the circuit). In the shrink mode, the shrink divider 36 in the selected PLL 16A or 16B may initially be programmed to divide by 2. The output CClk1 or CClk2 may settle to the same frequency as the other clocks CClk, based on the ClkIn frequency and the feedback divider 34. However, since the shrink divider 36 is programmed to divide by two, the VCO 32 in the selection PLL 16A or 16B may oscillate at a frequency that is twice the frequency of other VCOs 32 in other PLLs. Particularly, the VCO 32 may oscillate at the higher frequency that is desired for the preselected test clock cycle.

Based on the shrink trigger signal and the trigger count, the shrink control unit 18 may determine when the preselected clock cycle is occurring, and may change the shrink divider 36 to divide by 1 for two clock cycles. The shrink control unit 18 may change the shrink divider 36 to divide by 4 for one clock cycle. Then, the shrink control unit 18 may change the shrink divider 36 to divide by 2 again for the remainder of the test. The CClk that experienced the shrunken clock cycles may then be approximately back in sync with other CClks. In one embodiment, the CClk may remain slightly out of sync for the remainder of the ClkIn clock cycle, and may be corrected to return to sync in the following ClkIn clock cycle. The shrink control unit 18 may control the shrink divider 36 using the illustrated control signals for each PLL including the shrink divider 36 (e.g. the D1Ctl and D2Ctl signals). For example, in one embodiment, the shrink divider 36 may include a divide by 2, a pass through path (divide by 1) and a divide by 4 in parallel input to a mux. The shrink control unit 18 may control the mux to select the desired divisor for a given clock cycle. Other mechanisms for programming the shrink dividers 36 may be implemented in other embodiments.

It is noted that, while registers 20, 22, and 24 are shown as separate in FIG. 2, any one or more registers 20, 22, and 24 may be combined and the contents there of may be fields in the combined register. Also, other divisors than 1, 2, and 4 may be supported in the shrink dividers 36 for other embodiments that use other multiples of the clock frequency for shrink mode.

Figure 3:
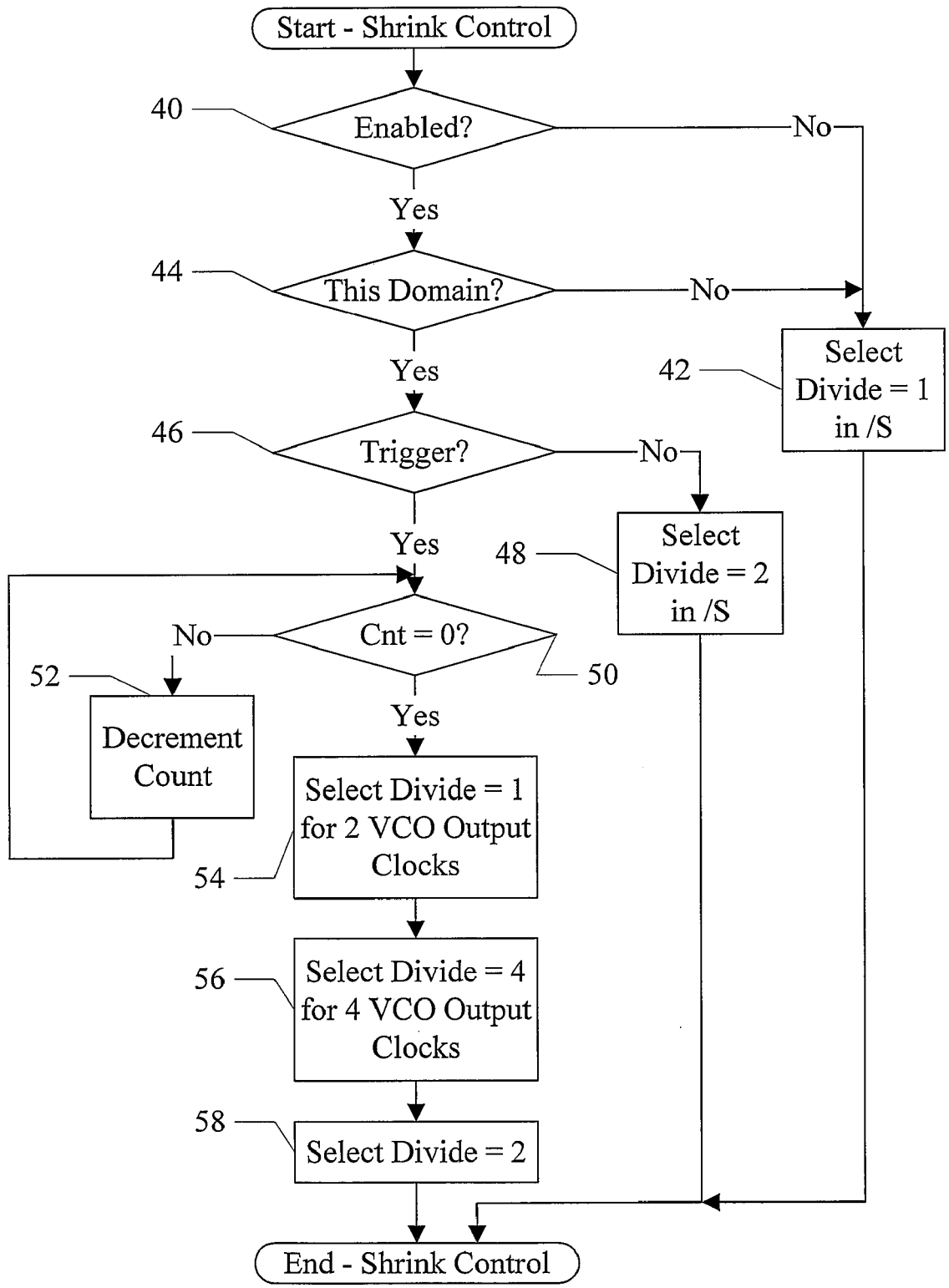
FIG. 3 is a flowchart illustrating operation of one embodiment of the shrink control circuit.

Turning now to FIG. 3, a flowchart is shown illustrating operation of one embodiment of the shrink control unit 18 for one of the clock domains (e.g. the PLL 16A clock domain). The shrink control unit 18 may perform similar operation, in parallel, for other clock domains that are capable of performing shrink mode. While the blocks are shown in a particular order for ease of understanding, other orders may be used. Blocks may be performed in parallel in combinatorial logic within the shrink control unit 18. Blocks, combinations of blocks, and or the flowchart as a whole may be pipelined over multiple clock cycles.

If shrink mode is not enabled (decision block 40, "no" leg), the shrink control unit 18 may select divide by one path in the shrink divider 36 (block 42). If shrink mode is enabled by the domain for the PLL 16A is not selected for shrink (decision block 44, "no" leg), the shrink control unit 18 may also select divide by one (block 42). If shrink mode is enabled and the PLL 16A's domain is selected, and the shrink trigger has not yet been asserted (decision block 46, "no" leg), the shrink control unit 18 may select divide by two in the shrink divider 36 (block 48).

If the shrink control unit 18 detects the assertion of the shrink trigger (decision block 46, "yes" leg, and shrink mode is enabled for this domain, decision blocks 40 and 44 "yes legs), the shrink control unit 18 may check the trigger count. If the trigger count is not zero (decision block 50, "no" leg), the shrink control unit 18 may decrement the trigger count (block 52) and may check the count again on the following clock cycle of the clock being monitored (e.g. the VCO output, as shown in FIG. 2, or the output of the shrink divider 36, in other embodiments). If the trigger count is zero (decision block 50, "yes" leg), the shrink control unit may select divide by 1 in the shrink divider 36 for two VCO output clock cycles (or two CClk clock cycles—block 54), then divide by 4 for 4 VCO output clock cycles (or one CClk clock cycle—block 56), then divide by two for the remainder of the test (block 58). It is noted that the shrink control unit 18 may implement blocks 54, 56, and 58 in any desired circuitry (e.g. a finite state machine).

Figure 4:
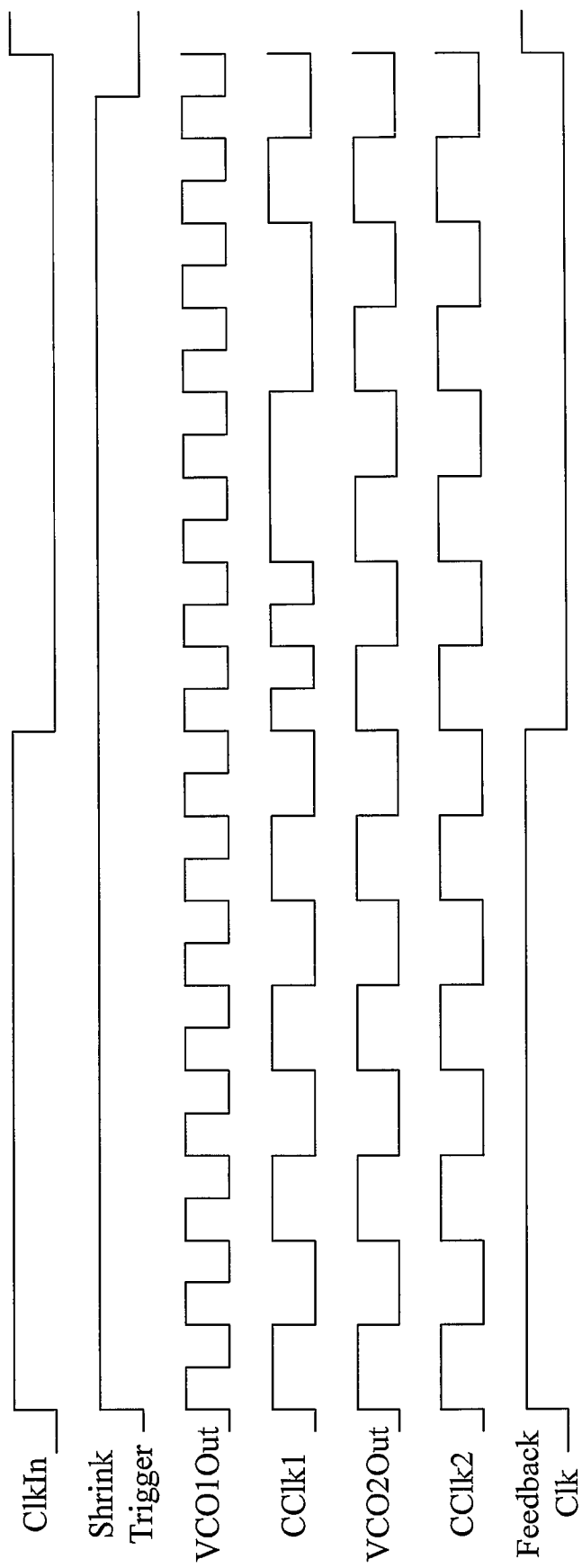
FIG. 4 is a timing diagram illustrating one embodiment of a shrink mode for testing.

Turning now to FIG. 4, an example is shown for a feedback divisor of 8 (the CClks frequencies are 8× the frequency of ClkIn) and the PLL 16A selected as the domain for shrink mode and programmed to shrink on the ninth VCO output clock cycle (fifth CCLK clock cycle for the non-shrinking clocks). The ClkIn clock is shown, and the shrink trigger is shown as asserted for the illustrated ClkIn clock cycle. While the shrink trigger is illustrated as being asserted coincident with the rising edge of the ClkIn clock in FIG. 4, the shrink trigger may actually be asserted with setup time before the rising edge of the ClkIn clock.

The output of the VCOs for both PLL 16A and PLL 16B is shown in FIG. 4 (VCO1Out and VCO2Out respectfully). Since the shrink divider 36 is set to divide by 2 for PLL 16A and divide by one for PLL 16B, the VCO1Out is oscillating at twice the frequency of VCO2Out (and 16 times the frequency of ClkIn, whereas the VCO2Out is oscillating at 8 times the frequency of ClkIn). The CClk1 and CClk2 are shown as well. The first four clock cycles of the CClk clocks, both CClk1 and CClk2 are oscillating at the same frequency (8 times the frequency of ClkIn). At the fifth CClk1 clock cycle, the frequency is doubled by selecting divide by one in the shrink divider 36 in the PLL 16A. Two clock cycles of CClk1 occur at twice the frequency of CClk2 (e.g. at the frequency of the VCO1Out clock). Then, divide by four is selected in the shrink divider 36 in the PLL 16A, and one clock cycle at ½ the frequency of CClk2 (¼ the frequency of the VCO1Out clock) may occur. Then, divide by two is selected again in the shrink divider 36 and the CClk1 rising edge is approximately in phase with the CClk2 rising edge (and the frequencies are again the same as well.

Finally, the feedback clock in the PLL 16A is shown (Feedback Clk in FIG. 4). The feedback clock is the output of the feedback divider 34, and illustrates that the PLL 16A does not lose lock to ClkIn. That is, the feedback clock is in phase with, and the same frequency as, ClkIn even while the shrink mode is performed.

Figure 5:
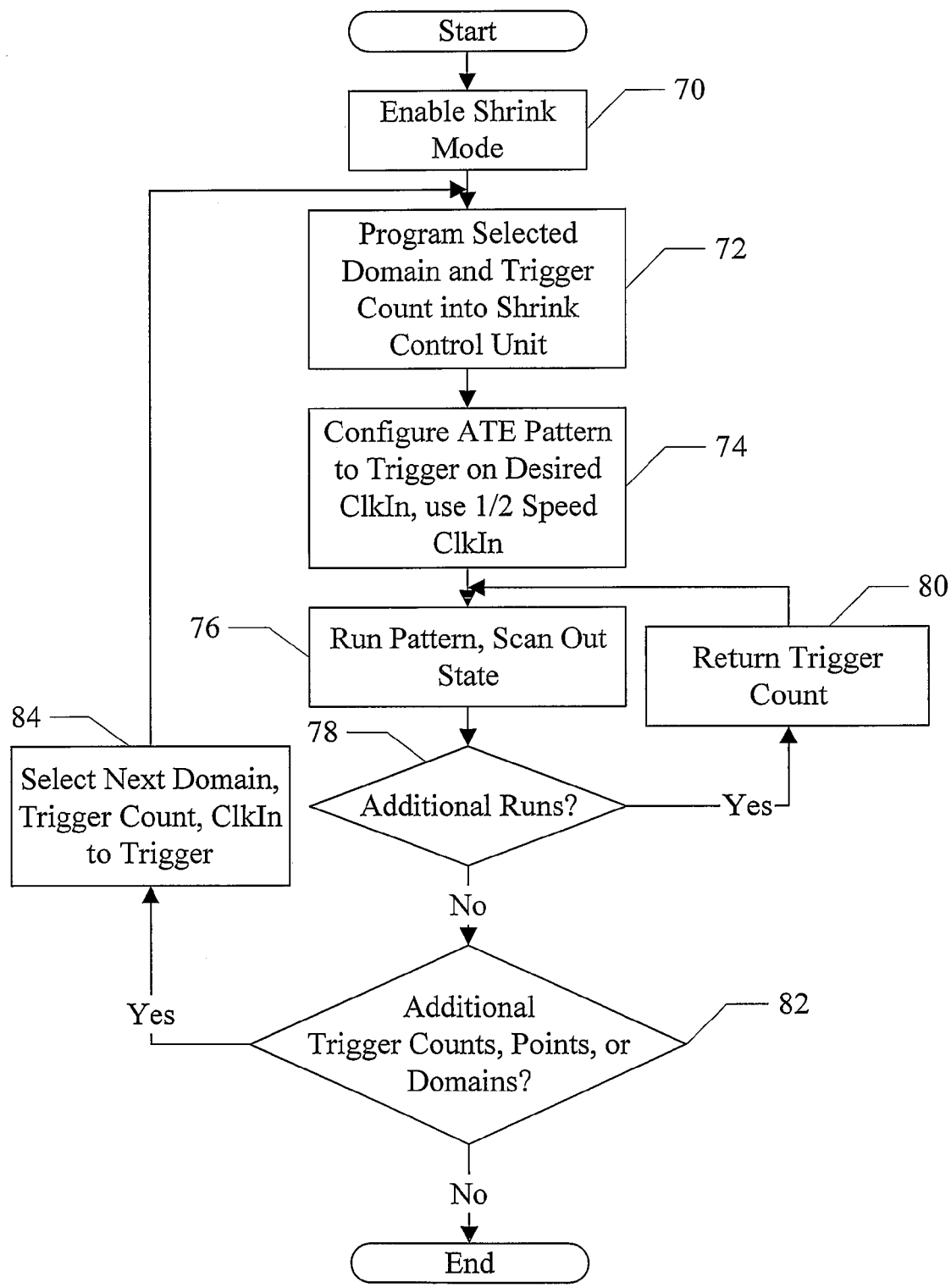
FIG. 5 is a flowchart illustrating one embodiment of a method using the shrink mode for testing.

Turning now to FIG. 5, a flowchart is shown illustrating one embodiment of using the shrink mode to test the integrated circuit 10. While the blocks are shown in a particular order for ease of understanding, other orders may be used. Blocks may also be performed in parallel, as desired.

Shrink mode may be enabled by programming the enable register 24 in the shrink control unit 18 (block 70). The selected domain and trigger count may be programmed into the shrink control unit 18 registers 22 and 20 (block 72), and the automatic test equipment (ATE) test pattern may be configured to trigger at the desired clock cycle of the ClkIn. A half frequency ClkIn may be used, as compared to the specified ClkIn frequency for normal operation (block 74). The integrated circuit 10 may be coupled to the ATE, and the test pattern may be run (block 76). The state of the integrated circuit 10 at the desired clock cycle may be scanned out. If additional runs are desired with the current configuration (e.g. to scan out the state at other clock cycles—decision block 78, "yes" leg), the trigger count in the shrink control unit 18 may be restored to the original trigger count (block 80), and the test pattern may be run again (block 76). In other embodiments, the trigger count may not be decremented directly (or a count may be incremented and compared to the trigger count) and the trigger count need not be restored. If no additional runs are desired with the current configuration (decision block 78, "no" leg) but runs with different trigger counts, ClkIn trigger points, and/or clock domains are desired (decision block 82, "yes" leg), the next domain, trigger count, and/or ClkIn clock cycle to trigger may be selected (block 84) and the shrink control unit 18 may be programmed appropriately for more test runs (block 72, and subsequent blocks as shown).

It is noted that a variety of algorithms may be used to select trigger points and counts. Various search algorithms may be used, for example, to search for speed paths on various clock cycles. Alternatively, information indicating which clock cycles sensitize suspected critical paths (e.g. from timing tools during the design phase) may be used to select the clock cycles to be shortened.

Numerous variations and modifications will become apparent to those skilled in the art once the above disclosure is fully appreciated. It is intended that the following claims be interpreted to embrace all such variations and modifications.

What is claimed is:

1. A method comprising:
   clocking first circuitry within an integrated circuit with a first clock at a first clock frequency during a test of the integrated circuit, wherein the first clock is coupled to the first circuitry;
   detecting a preselected clock cycle in the test;
   clocking the first circuitry at a second clock frequency that is greater than the first clock frequency for at least the preselected clock cycle in the test;
   detecting a failure in the test at the preselected clock cycle; and
   identifying a speed path at the preselected clock cycle, where at least one other speed path in the integrated circuit is longer than the speed path identified at the preselected clock cycle.

2. The method as recited in claim 1 further comprising clocking the first circuitry at the first clock frequency subsequent to clocking the first circuitry at the second clock frequency.

3. The method as recited in claim 2 further comprising clocking the first circuitry at a third clock frequency that is less than the first clock frequency between clocking the first circuitry at the second clock frequency and the subsequent clocking at the first clock frequency.

4. The method as recited in claim 3 wherein the clocking at the first clock frequency subsequent to clocking at the second clock frequency and the third clock frequency continues for a remainder of the test.

5. The integrated circuit as recited in claim 4 wherein the third clock frequency is one half the first clock frequency.

6. The method as recited in claim 3 wherein the second clock frequency is twice the first clock frequency.

7. The method as recited in claim 6 wherein the third clock frequency is one half the first clock frequency.

8. The method as recited in claim 1 further comprising supplying a clock input to the integrated circuit, wherein the first clock frequency and the second clock frequency are multiples of the clock frequency of the clock input.

9. The method as recited in claim 8 further comprising asserting a trigger input to the integrated circuit during a first clock cycle of the clock input within which the preselected clock cycle occurs.

10. The method as recited in claim 9 wherein the preselected clock cycle is a designated clock cycle of the first clock within the first clock cycle of the clock input, and the method further comprising programming the designated clock cycle into the integrated circuit prior to initiating the test.

11. The method as recited in claim 1 further comprising clocking second circuitry in the integrated circuit at the first clock frequency throughout the test.

12. An integrated circuit comprising:
   first circuitry;
   a first clock generator coupled to supply a first clock to the first circuitry, wherein the first clock generator is coupled to receive an input clock to the integrated circuit and is configured to generate the first clock; and
   a control unit coupled to the first clock generator and to receive a trigger input to the integrated circuit, wherein, during a test of the integrated circuit, the control unit is configured to cause the first clock generator to generate the first clock at a first clock frequency, and wherein the control unit is configured to cause the first clock generator to generate the first clock at a second frequency greater than the first clock frequency for at least one clock cycle responsive to an assertion of the trigger input.

13. The integrated circuit as recited in claim 12 wherein the control unit is further configured to cause the first clock generator to generate the first clock at the first clock frequency subsequent to causing the first clock generator to generate the first clock at the second clock frequency.

14. The integrated circuit as recited in claim 13 wherein the control unit is further configured to cause the first clock generator to generate the first clock at a third clock frequency that is less than the first clock frequency between clocking the first circuitry at the second clock frequency and the subsequent clocking at the first clock frequency.

15. The integrated circuit as recited in claim 14 wherein the second clock frequency is twice the first clock frequency.

16. The integrated circuit as recited in claim 12 wherein the first clock generator comprises a clock divider circuit configured to output the first clock, wherein the control unit is configured to control the clock divider circuit.

17. The integrated circuit as recited in claim 16 wherein the first clock generator is a phase locked loop (PLL), and wherein the PLL comprises a voltage controlled oscillator (VCO), and wherein an output of the VCO is an input to the clock divider circuit.

18. The integrated circuit as recited in claim 17 further comprising a second clock divider circuit coupled to receive the first clock and supply a second clock for phase comparison to the input clock.

19. The integrated circuit as recited in claim 12 wherein the control unit is programmable to select the first clock cycle within a clock cycle of the input clock.

20. The integrated circuit as recited in claim 19 wherein the first clock generator is one of a plurality of clock generators, and wherein the control unit is programmable to select among at least a subset of the plurality of clock generators.

* * * * *